(12) United States Patent
Tang

(10) Patent No.: US 10,680,507 B2
(45) Date of Patent: Jun. 9, 2020

(54) METHOD AND APPARATUS FOR MULTIPHASE REGULATOR WITH THERMAL ADAPTIVE PHASE ADD/DROP CONTROL

(71) Applicant: Infineon Technologies Austria AG, Villach (AT)

(72) Inventor: Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 27 days.

(21) Appl. No.: 15/581,737

(22) Filed: Apr. 28, 2017

(65) Prior Publication Data

US 2018/0316255 A1 Nov. 1, 2018

(51) Int. Cl.
*H02M 1/084* (2006.01)
*H02M 3/158* (2006.01)
*H02M 3/157* (2006.01)
*H05K 7/20* (2006.01)
(Continued)

(52) U.S. Cl.
CPC .......... *H02M 1/084* (2013.01); *H02M 3/157* (2013.01); *H02M 3/158* (2013.01); *H02M 3/1584* (2013.01); *H05K 7/20909* (2013.01); *H02M 2001/0009* (2013.01); *H02M 2001/0054* (2013.01); *H02M 2001/327* (2013.01); *H02M 2003/1586* (2013.01); *Y02B 70/1491* (2013.01)

(58) Field of Classification Search
CPC ...... H02M 1/084; H02M 3/157; H02M 3/158; H02M 2001/0009; H02M 3/1584; H02M 2003/1586; H05K 7/20909
See application file for complete search history.

(56) References Cited

U.S. PATENT DOCUMENTS

| 6,563,294 B2 | 5/2003 | Duffy et al. |
| 6,728,104 B1* | 4/2004 | Ahmad .............. H05K 7/20563 165/185 |
| 6,795,009 B2 | 9/2004 | Duffy et al. |

(Continued)

FOREIGN PATENT DOCUMENTS

JP 2007116834 A 5/2007

*Primary Examiner* — Nguyen Tran
*Assistant Examiner* — Demetries A Gibson
(74) *Attorney, Agent, or Firm* — Murphy, Bilak & Homiller, PLLC

(57) ABSTRACT

A multiphase regulator having a variable number of phases in operation and nominal current thresholds for indicating when to add or drop a phase is provided. A digital controller for the regulator includes digital circuitry configured to adjust the nominal current thresholds based on a measured or estimated temperature of the regulator, to yield adjusted current thresholds which are a function of temperature. The digital circuitry is further configured to modify the number of phases in operation based on the adjusted current thresholds and a measured or estimated current in the regulator. The regulator can be included in an electronic component having a load, power stages for providing phase currents to the load, and at least one fan for cooling the power stages and load. The digital controller controls operation of the regulator, including adaptive control of the number of phases in operation. Corresponding control methods are also provided.

13 Claims, 6 Drawing Sheets

(51) Int. Cl.
  *H02M 1/00*  (2006.01)
  *H02M 1/32*  (2007.01)

(56) References Cited

U.S. PATENT DOCUMENTS

| | | |
|---|---|---|
| 7,492,134 B2 | 2/2009 | Tang et al. |
| 7,982,441 B2 | 7/2011 | Crowther et al. |
| 8,193,796 B2 | 6/2012 | Tang et al. |
| 8,242,759 B2 | 8/2012 | Carroll et al. |
| 8,829,872 B1 | 9/2014 | Pierson et al. |
| 9,317,047 B2 | 4/2016 | Zambetti et al. |
| 9,698,683 B2 * | 7/2017 | Babazadeh ............ H02M 3/157 |
| 2005/0264363 A1 * | 12/2005 | Kang ..................... H03F 1/30 330/289 |
| 2006/0001408 A1 * | 1/2006 | Southwell ........... H02M 3/1584 323/282 |
| 2006/0181990 A1 * | 8/2006 | Lai ........................... G11B 7/00 369/47.55 |
| 2011/0121795 A1 | 5/2011 | Vulih et al. |
| 2012/0086416 A1 * | 4/2012 | Kudo ................... H02M 3/1584 323/265 |
| 2012/0091815 A1 | 4/2012 | Richards |
| 2012/0200274 A1 * | 8/2012 | Tang ................... H02M 3/1584 323/271 |
| 2013/0057239 A1 * | 3/2013 | Kalje ................... H02M 3/1584 323/271 |
| 2013/0241519 A1 | 9/2013 | Li et al. |
| 2015/0258947 A1 | 9/2015 | Harkins |
| 2015/0303799 A1 * | 10/2015 | Tang ..................... H02M 3/158 323/271 |
| 2015/0349634 A1 * | 12/2015 | Tschirhart .............. G01R 19/32 323/271 |

* cited by examiner

METHOD AND APPARATUS FOR MULTIPHASE REGULATOR WITH THERMAL ADAPTIVE PHASE ADD/DROP CONTROL

TECHNICAL FIELD

The present application relates to multiphase regulators, in particular adaptive phase add/drop control for multiphase regulators.

BACKGROUND

Switching power supplies or voltage regulators/converters are widely used in high power applications because of their high efficiency and the small amount of area/volume consumed by such regulators. Widely accepted switching voltage regulators include buck, boost, buck-boost, forward, flyback, half-bridge, full-bridge, and SEPIC topologies. Multiphase buck converters are particularly well suited for providing high current at low voltages needed by highly integrated electronic components such as microprocessors, graphics processors, and network processors. Buck converters are typically implemented with active components such as a pulse width modulation (PWM) controller IC (integrated circuit), driver, power MOSFETs (metal-oxide-semiconductor field-effect transistors), and passive components such as inductors, transformers or coupled inductors, capacitors, and resistors. Parallel converters are also used in applications where high current requirements can be met by connecting multiple output converters in parallel and applying current sharing between them to meet the total output current requirement. The terms 'multiphase regulator' and 'parallel converter' are used interchangeably herein, as are the terms 'output phase' and 'output converter'.

Highly integrated electronic components typically require accurate voltage supplies capable of supplying large amounts of current and power, while maintaining tight voltage regulation and subject to tight implementation area constraints. A common power distribution scheme involves the use of an intermediate bus, where a higher voltage AC or DC bus is converted to an intermediate voltage, (e.g. 12V), and then multiple point-of-load voltage regulators are connected to this intermediate bus and step down the voltage to satisfy low voltage, high current demand of the electronic components. Multiphase buck converters are well suited for this sort of step down converter application, because multiphase buck converters are capable of supplying currents in excess of 50 A per phase at voltages below 1V, and are scalable by adding multiple phases in parallel and interleaving the operation of the phases. However, operating at low currents results in low efficiency as the power losses do not scale down as phase current decreases. Switching losses are the losses that occur due to high voltage and current experienced by the switch of a phase when transitioning from on to off state and vice-versa. Switching losses are insignificant at nominal to heavy loads, but at light load conditions, switching losses become more significant, reducing the efficiency of a multiphase converter system.

Proper power and heat management are critical to maximize system performance. This includes (a) maximizing both the peak instantaneous power delivered over a short duration (commonly referred to as burst or turbo mode operation) and the long-term time average power delivered over a longer duration, (b) maximizing the energy efficiency of the system, (c) powering system fan(s) to maintain component temperature within permitted operating limits, and (d) minimizing losses during low power operation such as in idle and sleep mode operation.

Multiphase buck converters which dynamically adjust the number of phases in operation, using phase shedding (dropping) techniques, are widely used to provide improved light load efficiency operation. This is particularly significant in systems where the load current is highly dynamic, bursty and variable over time. For example, in multicore and multiprocessor systems, it is generally preferable to fully load some processors while leaving other processors idle. In addition, it is preferable for cores to operate in a bursty, low latency manner, where high throughput processing is provided as soon as it is needed, and then resume idle or background operation after the task is completed.

In an intermediate bus type architecture, it is desirable to minimize both power and current capability of the intermediate bus, so that the intermediate bus can provide the time-average power needs, but not necessarily the worst-case peak power needs, so as to minimize power supply cost. However, this leaves the system vulnerable to operational failure when the power supply fails to deliver the necessary instantaneous power demand of the system.

A solution which maximizes the peak and average power demand, while also providing efficient light load operation, robust operation under peak load condition, and minimizing system cost is desirable.

SUMMARY

According to an embodiment of a method of controlling a multiphase regulator having a variable number of phases in operation and nominal current thresholds for indicating when to add or drop a phase in operation, the method comprises: measuring or estimating a current in the multiphase regulator; measuring or estimating a temperature of the multiphase regulator; adjusting the nominal current thresholds based on the temperature to yield adjusted current thresholds which are a function of temperature; and modifying the number of phases of the multiphase regulator in operation based on the current and the adjusted current thresholds.

According to an embodiment of a digital controller for a multiphase regulator having a variable number of phases in operation and nominal current thresholds for indicating when to add or drop a phase of the multiphase regulator, the digital controller comprises digital circuitry configured to: adjust the nominal current thresholds based on a measured or estimated temperature of the multiphase regulator, to yield adjusted current thresholds which are a function of temperature; and modify the number of phases of the multiphase regulator in operation based on the adjusted current thresholds and a measured or estimated current in the multiphase regulator.

According to an embodiment of a multiphase regulator, the multiphase regulator comprises a plurality of power stages each configured to provide a phase of the multiphase regulator to a load and a digital controller. The digital controller is configured to: store nominal current thresholds for indicating when to add or drop a phase of the multiphase regulator; adjust the nominal current thresholds based on a measured or estimated temperature of the multiphase regulator, to yield adjusted current thresholds which are a function of temperature; and modify the number of phases of the multiphase regulator in operation based on the adjusted current thresholds and a measured or estimated current in the multiphase regulator.

According to an embodiment of an electronic component, the electronic component comprises a board, a load attached to the board, a plurality of power stages attached to the board and each configured to provide a phase current to the load, at least one fan configured to cool the plurality of power stages and the load, and a digital controller. The digital controller is configured to: store nominal current thresholds for indicating when to add or drop a phase of the multiphase regulator; adjust the nominal current thresholds based on a measured or estimated temperature of the multiphase regulator, to yield adjusted current thresholds which are a function of temperature; and modify the number of phases of the multiphase regulator in operation based on the adjusted current thresholds and a measured or estimated current in the multiphase regulator.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide adaptive phase add/drop control in multiphase regulators based on both current and temperature. Phase shedding (dropping) is a technique for reducing switching losses at light-load conditions, and which involves decreasing the number of regulator phases in operation i.e. actively supplying current to the load. Phase adding involves increasing the number of regulator phases in operation to accommodate greater load demand. The adaptive phase add/drop control techniques described herein adjust the current thresholds used to add/drop regulator phases based on both current and temperature. For example, when operating at relatively low temperatures, the system maximizes efficiency by placing an optimum number of phases in operation. The current thresholds for determining the optimum number of phases can be chosen to maximize efficiency and transient response. When operating at higher temperatures, e.g. near the thermal limit of a regulator phase, the system distributes the thermal load more evenly across the phases by reducing the current thresholds for phase shed (drop) transitions based on both current and temperature, so that at high temperatures, and only for very low phase current, is a phase dropped.

Figure 1:
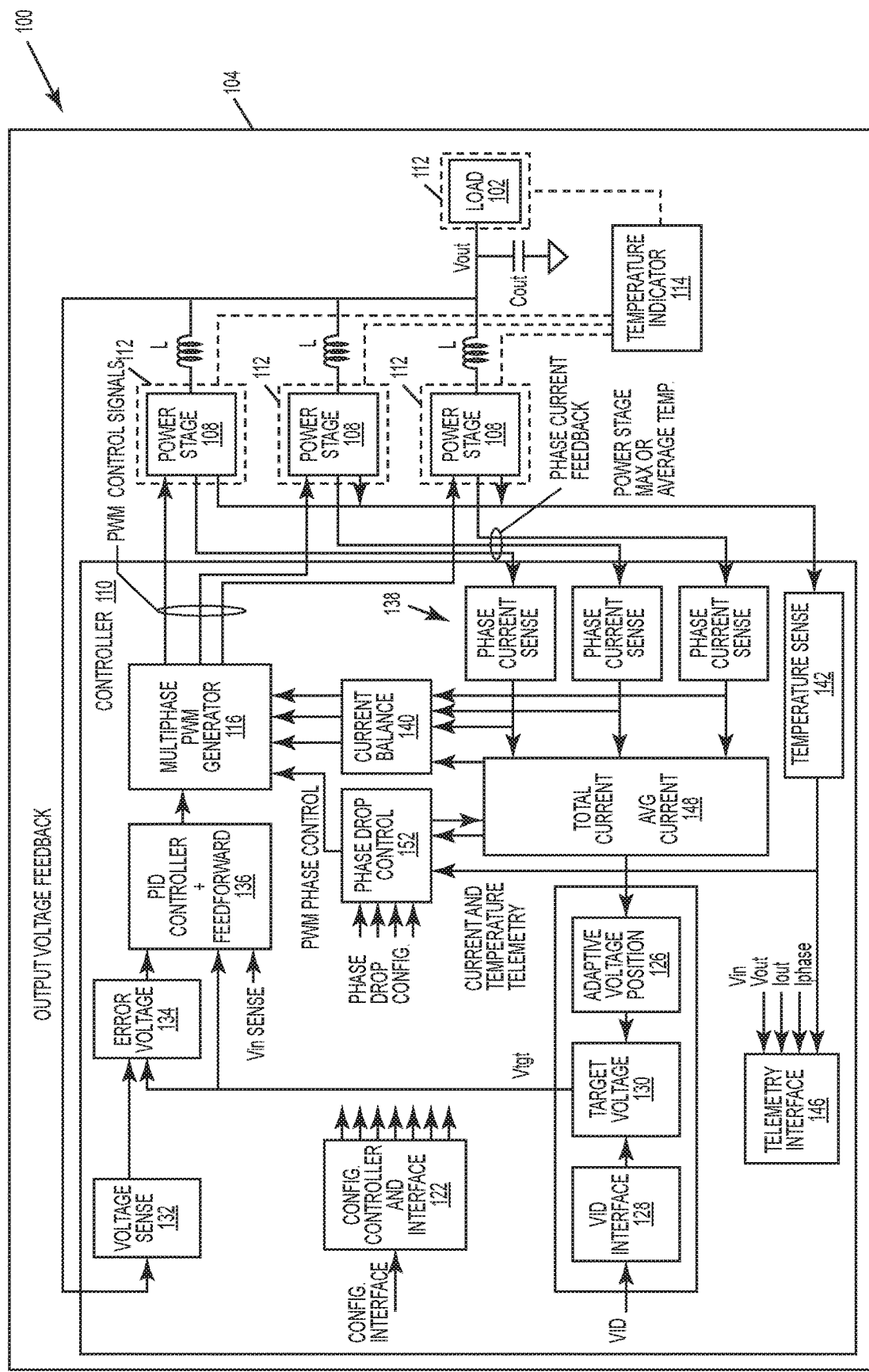
FIG. 1 illustrates a block diagram of an embodiment of an electronic component that includes a multiphase regulator having a digital controller with an adaptive phase add/drop unit.
Figure 1:
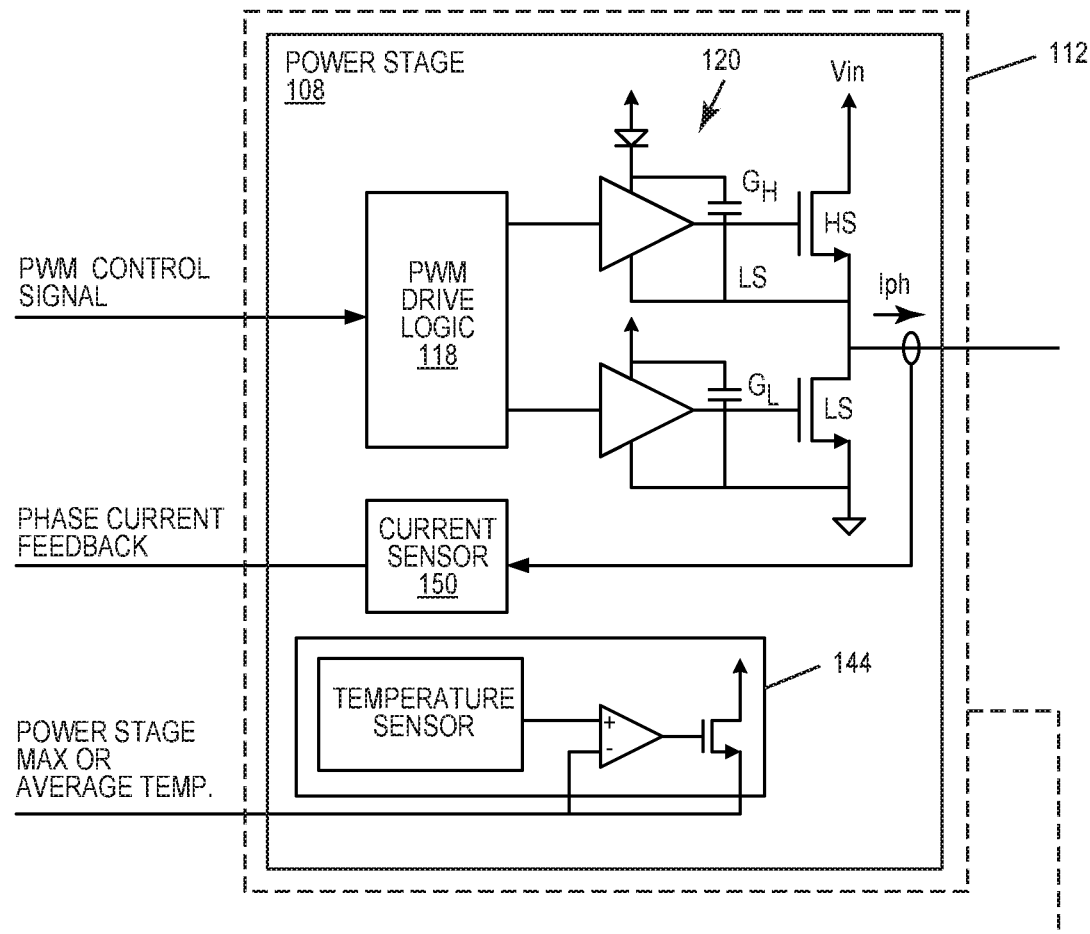

FIG. 1 illustrates an embodiment of an electronic component 100 that includes a load 102 attached to a board 104 and a multiphase regulator 106 for supplying power to the load 102. The multiphase regulator 106 includes a plurality of power stages 108 attached to the board 104 and configured to provide a phase current to the load 102, and a digital controller 110 for controlling operation of the regulator 106. The electronic component 100 further includes at least one fan 112 for cooling the power stages 108 and the load 102. The fan(s) 112 may have variable speed control, and may be driven by a temperature indicator 114 on the board 104 along the main airflow path. Each fan 112 is designed to cool a particular circuit e.g. CPU, graphics processor, power stage, etc. All fans 112 may be controlled the same way by the temperature indicator 114, e.g. to have the same speed. Each fan 112 is illustrated as a dashed box in FIG. 1 for ease of illustration of the other system components.

Each power stage 108 of the multiphase regulator 106 provides one phase of the regulator 106 for delivering a phase current (Iph) through a separate inductor (L) to the load 102, each power stage supplying a portion of the load current so that the total current is divided among the operating phases. The load 102 can include one or more high performance integrated electronic components such as microprocessors, graphics processors, network processors, memories, etc., and is connected to the power stages 108 of the multiphase regulator 106 via the respective inductors and an output capacitor (Cout). Each power stage 108 has a high-side switch device (HS) and a low-side switch device (LS) for coupling to the load 102 through the corresponding inductor. The high-side switch device of each power stage 108 switchably connects the load 102 to an input voltage (Vin) of the multiphase regulator 106, and the corresponding low-side switch device switchably connects the load 102 to ground at different periods. Three power stages 108 are shown in FIG. 1, however the multiphase regulator 106 can include any number of power stages (phases) greater than one.

The digital controller 110, which may be a microcontroller and firmware, an application-specific integrated-circuit (ASIC), digital signal processor (DSP), etc., regulates the voltage (Vout) delivered to the load 102, by adjusting the phase currents delivered to the load 102 via the power stages 108. In one embodiment, the digital controller 110 includes a multiphase pulse width modulator (PWM) 116 for switching the switch devices of each power stage 108 so that each individual power stage 108 can source positive current to the load 102 through its high-side switch device (e.g. one or more high-side transistors) during some periods and sinks negative current from the load 102 through its low-side switch device (e.g. one or more of low-side transistors) during other periods. That is, the multiphase regulator 106 can operate in a continuous conduction mode (CCM) with current sinking capability. For example, only one power stage 108 may be active at times, e.g., during light-load conditions. One or more additional power stages 108 can be activated to support greater power demands by the load 102. To this end, the multiphase PWM 116 provides PWM control signals to drive logic 118 of each power stage 108.

The drive logic 118 and related driver circuitry 120 provide the actual gate drive signals ($G_H$, $G_L$) to the respective gates of the high-side and low-side switch devices of the corresponding power stages 108, in response to the PWM control signals provided by the multiphase PWM 116. The activation state of the individual power stages 108 (i.e.

whether a power stage is in operation or not) and the duty cycle of the high-side and low-side switch devices are determined at least in part based on the output voltage (Vout) applied to the load 102, so that the multiphase regulator 106 can react as quickly and reliably as possible to changing load conditions. The digital controller 110 can set the multiphase regulator 106 in DCM (discontinuous conduction mode) if load conditions warrant.

The digital controller 110 also includes a configuration controller and interface 122 for receiving configuration information e.g. from the load 102, and programming the multiphase regulator 106 in accordance with the configuration information. The digital controller 110 further includes a voltage position unit 124 for controlling changes from one VID to another by ramping a target voltage, where 'VID' is voltage identification information provided to the multiphase regulator 106 for implementing power supply voltage changes. The voltage position unit 124 can include an adaptive voltage positioning (AVP) circuit 126 for converting the phase current information into an offset from a set-point, to set the regulator target voltage based on load current. The voltage position unit 124 can also include a VID interface 128 for converting the VID information to a target voltage, and further logic 130 for setting the target voltage (Vtgt) of the regulator 106 based on the target voltage information provided by the VID interface 128 and the offset information provided by the AVP circuit 126.

A voltage sense unit 132 of the digital controller 110 senses the output voltage feedback, and a voltage error circuit 134 determines the error between the output voltage feedback and the target voltage (Vtgt) provided by the voltage position unit 124. A PID (proportional-integral-derivative) or similar controller 136 with standard feedforward control converts the error voltage, the target voltage Vtgt and the sensed input voltage (Vin Sense) into a digital representation provided to the multiphase PWM 116. Current sense circuitry 138 senses the individual phase currents of the power stages 108, and a current balance unit 140 converts the sensed current information into phase current information. The current balance unit 140 converts the phase current information into adjustments to the duty cycle of each individual power stage 108, for adjusting the phase currents so they remain balanced.

The digital controller 110 also includes a temperature sense unit 142 for processing temperature information for the power stages 108. For example, the individual power stages 108 may include a temperature sense circuity 144 for sensing the maximum or average temperature of the power stage 108. This information is reported back to the temperature sense unit 142 included in the digital controller 110, e.g., in the form of average or maximum temperature information. The digital controller 110 has a telemetry interface 146 for receiving various telemetry information such as the power stage temperature information, input voltage (Vin), output voltage (Vout), output current (Iout), phase current (Iphase), etc. A current computation unit 148 calculates peak and average phase current information and total output load current based on the current data provided by a phase current sensor 150 included in each power stage 108.

The digital controller 110 also includes a phase add/drop unit 152 for implementing the adaptive phase add/drop control techniques described herein. The phase add/drop unit 152 implements the adaptive phase add/drop control techniques described herein based on nominal current thresholds that indicate when to add or drop a phase in operation, the power stage temperature information provided by the temperature sense unit 142 and the peak and average phase current information provided by the current computation unit 148. The adaptive phase add/drop algorithm implemented by the phase add/drop unit 152 provides smooth transitions for adding and dropping phases, as the power stages transition from switching the power switches with some phase current to not switching with zero current.

Figure 2:
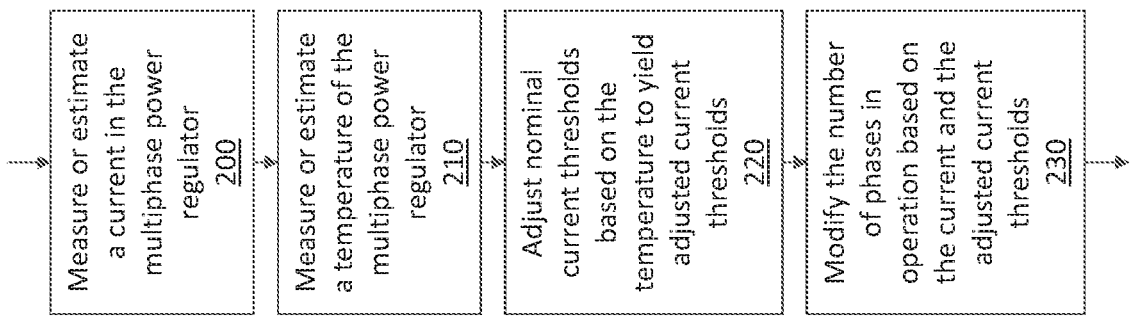
FIG. 2 illustrates a flow diagram of an embodiment of an adaptive phase add/drop control method performed by the digital controller.

FIG. 2 illustrates a flow diagram of the adaptive phase add/drop algorithm implemented by the phase add/drop unit 152 of the digital controller 110. The digital controller 110 measures or estimates a current in the multiphase regulator 106 (Block 200). For example, average and/or peak phase current sensed by the current sense circuitry 138 and computed by the current computation unit 148 can be used. The digital controller 110 also measures or estimates at least one temperature of the multiphase regulator 106 (Block 210). For example, average and/or maximum phase temperature sensed by the power stage temperature sensors 144 and processed by the temperature sense unit 142 can be used. The phase add/drop unit 152 adjusts the nominal current thresholds based on the measured/estimated temperature to yield adjusted current thresholds which are a function of temperature (Block 220), and modifies the number of phases (power stages) of the multiphase regulator 106 in operation based on the measured/estimated current and the adjusted current thresholds to optimize the efficiency of the regulator 106 given the required load current (Block 230). This way, the adaptive phase add/drop control algorithm implemented by the digital controller 110 is based on both current and temperature.

Firmware or additional logic can be provided to configure and modify the nominal current thresholds, including by dynamically adjusting the nominal current thresholds based on a temperature profile of the multiphase regulator 106. For example, firmware can change the values of the nominal current thresholds to adjust the current thresholds as explained above. Temperature can be monitored, and depending on the monitored temperature, firmware can be written to change the nominal current thresholds. The adaptive phase add/drop algorithm implemented the phase add/drop unit 152 can be partly or fully implemented in hardware and/or firmware.

The temperature information processed by the phase add/drop unit 152 of the digital controller 110 to implement the adaptive phase add/drop algorithm illustrated in FIG. 2 can be provided by temperature sensors 144 integrated with the power stages 108 e.g. as illustrated in FIG. 1. The integrated temperature sensors 144 may report the single highest (maximum) temperature for all the power stages 108, which is the temperature of the hottest power stage 108. This power stage 108 is the most localized heat spot of the multiphase regulator 106, and benefits the most from the adaptive phase add/drop algorithm in that one or more additional phases in operation will reduce the temperature of the hottest phase.

In addition or alternatively, average temperature reporting can be used. If only average temperature data is reported to the phase add/drop unit 152 of the digital controller 110 (and not also maximum temperature data), the phase add/drop unit 152 will not know which phase (power stage) is running the hottest.

In addition or alternatively, a component on the board 104 such as a discrete temperature sensor could report the temperature information. For example, a temperature sensor can be positioned near the last phase and the phase add/drop unit 152 can use the temperature information provided by such a sensor for adjusting the nominal current thresholds since the last phase is always in operation (even in light-load conditions).

With the adaptive phase add/drop technique illustrated in FIG. 2, if a power stage 108 is running hot and its fan 112 is on or perhaps even running at maximum speed, the phase add/drop unit 152 of the digital controller 110 can place one or more additional power stages 108 in operation even though doing so decreases regulator efficiency. However, overall system efficiency increases since the fan 112 associated with the power stage 108 that is running the hottest will slow down or even turn off when additional power stage(s) 108 are placed in operation, thereby more evenly distributing the heat load across more power stages 108.

Figure 3:
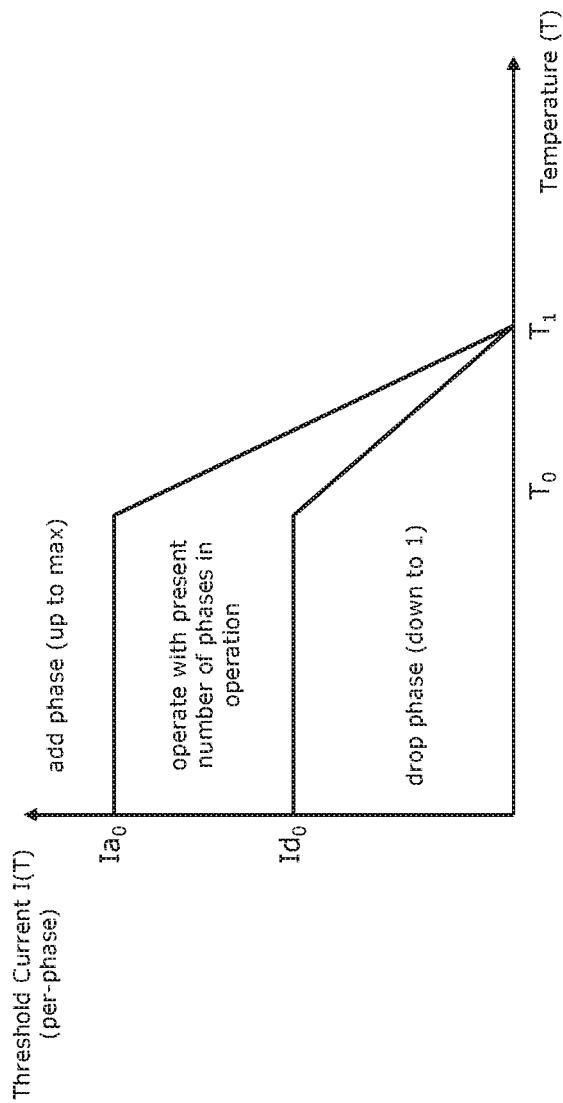
FIG. 3 illustrates a graphical diagram of a first embodiment of the adaptive phase add/drop control method performed by the digital controller.

FIG. 3 illustrates a first embodiment of the adaptive phase add/drop control algorithm implemented by the phase add/drop unit 152 of the digital controller 110. According to this embodiment, the nominal current thresholds adjusted by the phase add/drop unit 152 are per-phase current thresholds which are a function of temperature (T). The nominal current thresholds are reduced as temperature increases.

In more detail, the nominal current thresholds include a first per-phase nominal current threshold $Ia_0$ for indicating when to add a phase (power stage) of the multiphase regulator 106 in operation and a second per-phase nominal current threshold $Id_0$ for indicating when to drop a phase of the regulator 106 in operation. The phase add/drop unit 152 adjusts the nominal current thresholds $Ia_0$ and $Id_0$ based on temperature, by reducing the per-phase nominal current thresholds $Ia_0$ and $Id_0$ responsive to the measured/estimated temperature (T) exceeding a first temperature level $T_0$ as given by:

$$Ix(T) = \begin{cases} Ix_0, & T \le T_0 \\ Ix_0(1 - kx(T - T_0)), & T_0 < T \le T_1 \\ 0, & T > T_1 \end{cases} \quad (1)$$

where Ix(T) is the per-phase temperature-dependent current threshold for adding (x=a) or dropping (x=d) a phase.

With this approach, the multiphase regulator 106 functions with the present number of phases in operation if the measured/estimated phase current remains between the temperature-dependent add/drop thresholds Ia(T)/Id(T) calculated by the phase add/drop unit 152 in accordance with equation (1). If the measured/estimated phase current rises above the temperature-dependent add threshold Ia(T), the phase add/drop unit 152 adds one or more additional phases in operation (up to the maximum number of phases). If the measured/estimated phase current falls below the temperature-dependent drop threshold Id(T), the phase add/drop unit 152 drops one or more phases in operation (down to a single phase).

The multiphase regulator 106 operates with a maximum number of phases in operation and the phase add/drop unit 152 prevents dropping of any phases if the measured/estimated temperature exceeds a second temperature level T1 which is above the first temperature level T0 and below a maximum temperature limit specified for each power stage 108. If the measured/estimated temperature drops below the lower threshold $T_0$, the (original) nominal per-phase current thresholds $Ia_0$ and $Id_0$ can once again used by the phase add/drop unit 152 in deciding whether to add or drop a phase in operation.

In one embodiment, the first and second per-phase nominal current thresholds $Ia_0$ and $Id_0$ are linearly reduced with a negative slope k responsive to the measured/estimated temperature exceeding the first temperature level $T_0$. The negative slope term $kx(T-T_0)$ in equation (1) is a function of increasing temperature and can be expressed as:

$$kx = \frac{Ix_0}{(T_1 - T_0)} \quad (2)$$

where $Ix_0$ is the per-phase nominal current threshold for adding (x=a) or dropping (x=d) a phase.

Figure 4:
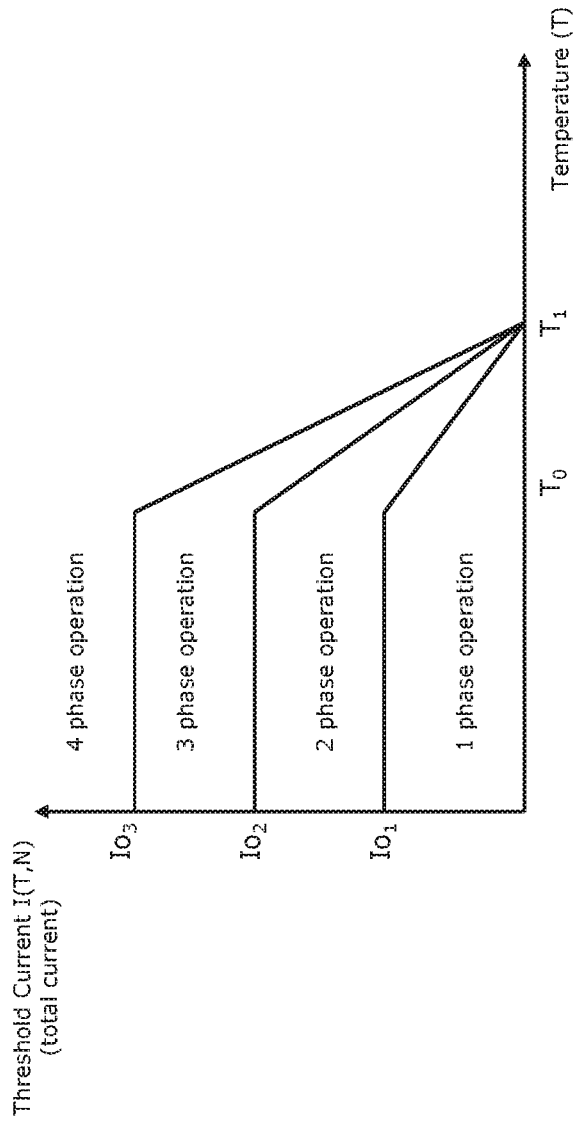
FIG. 4 illustrates a graphical diagram of a second embodiment of the adaptive phase add/drop control method performed by the digital controller.

FIG. 4 illustrates a second embodiment of the adaptive phase add/drop control algorithm implemented by the phase add/drop unit 152 of the digital controller 110. According to this embodiment, the nominal current thresholds include a nominal total current threshold for each number of the phases in operation. Each nominal total current threshold is a function of temperature (T) and the number (N) of phases in operation for the corresponding number of phases of operation. In FIG. 4, $I_{O1}$ is the nominal total current threshold for going from single-phase operation to two-phase operation, $I_{O2}$ is the nominal total current threshold for going from two-phase operation to three-phase operation, and $I_{O3}$ is the nominal total current threshold for going from three-phase operation to four-phase operation. In some cases, $Io_2 = 2 \times Io_1$ and $Io_3 = 3 \times Io_1$. As previously mentioned herein, the multiphase regulator 106 has two or more power stages (phases). The nominal total current thresholds may scale as a function of the number of phases as explained above, or may be set in a different way. In either case, the nominal total current thresholds are reduced as temperature increases.

In more detail, the phase add/drop unit 152 reduces each nominal total current threshold responsive to the measured/estimated temperature exceeding a first temperature level $T_0$ and prevents phase drop as temperature exceeds a second temperature level $T_1$ above the first temperature level $T_0$ as given by:

$$I(T, N) = \begin{cases} Io_N, & T \le T_0 \\ Io_N(1 - k_N(T - T_0)), & T_0 < T \le T_1 \\ 0, & T > T_1 \end{cases} \quad (3)$$

where I(T,N) is the temperature-dependent total current threshold for adding or dropping a phase in operation for N phases of operation.

With this approach, the multiphase regulator 106 operates with the present number N of phases in operation if the measured/estimated total current remains below the temperature-dependent total current threshold I(T,N) for N phases of operation. If the measured/estimated phase current rises above the temperature-dependent total current threshold I(T,N) for N phases of operation, the phase add/drop unit 152 adds an additional phase in operation (up to the maximum number of phases) and subsequently compares the measured/estimated phase current to the temperature-dependent total current threshold I(T,N+1) for N+1 phases of operation to determine whether another phase should be added in operation. Conversely, if the measured/estimated phase current falls below the temperature-dependent total current threshold I(T,N) for N phases of operation, the phase add/drop unit 152 drops a phase in operation (down to a single phase) and compares the measured/estimated phase current to the temperature-dependent total current threshold I(T,N−1) for N−1 phases of operation to determine whether another phase should be dropped in operation.

The multiphase regulator 106 operates with a maximum number of phases (power stages) in operation and the phase add/drop unit 152 prevents dropping of any phases if the measured/estimated temperature exceeds the second temperature level T1 which is above the first temperature level T0 and below a maximum temperature limit specified for each power stage. If the measured/estimated temperature drops below the lower threshold $T_0$, the (original) nominal total current thresholds $Io_1$, $Io_2$, $Io_3$, etc. can once again used by the phase add/drop unit 152 in deciding whether to add or drop a phase in operation.

In one embodiment, each nominal total current threshold is linearly reduced with a negative slope responsive to the temperature exceeding the first temperature level. The negative slope term $k_N(T-T_0)$ in equation (3) is a function of increasing temperature and can be expressed as:

$$k_N = \frac{Io_N}{(T_1 - T_0)} \quad (2)$$

where $I_{ON}$ is the nominal total current threshold for adding or dropping a phase with N phases of operation.

The adaptive phase add/drop control embodiments illustrated in FIGS. 3 and 4 both define a relationship between temperature and current thresholds for adding and dropping phases. The embodiment illustrated in FIG. 3 adapts per-phase current thresholds for adding/dropping phases as a function of temperature. The embodiment illustrated in FIG. 4 adapts total current thresholds for adding/dropping phases as a function of temperature. In both embodiments, current thresholds are adaptively determined as a function of temperature to more evenly distribute heat across the power stages 108.

Figure 5:
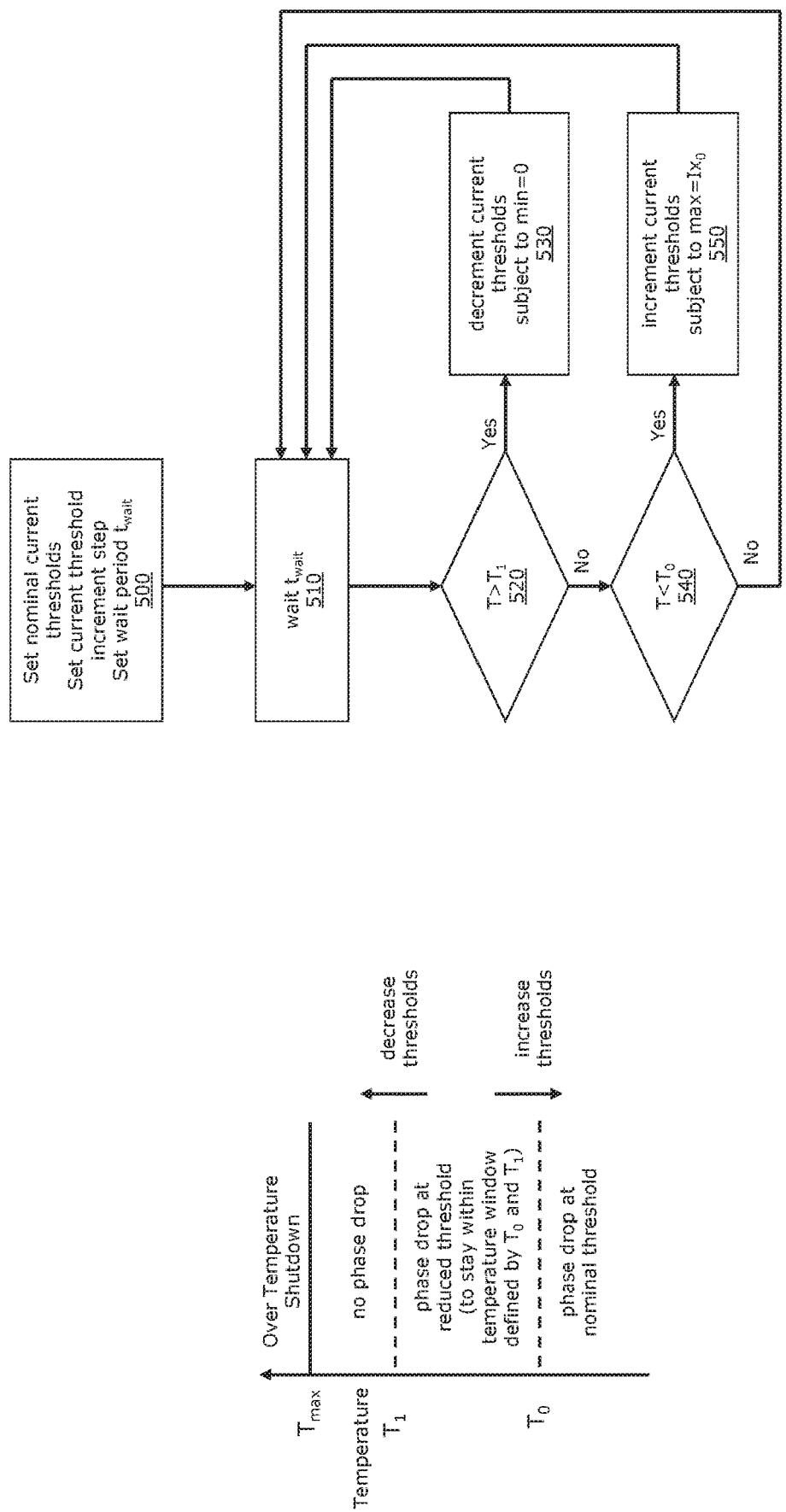
FIG. 5 illustrates a graphical diagram of a third embodiment of the adaptive phase add/drop control method performed by the digital controller.

FIG. 5 illustrates another embodiment of the adaptive phase add/drop control algorithm implemented by the phase add/drop unit 152 of the digital controller 110, in which the phase add/drop unit 152 adjusts the phase add/drop current thresholds to maintain the temperature between a lower temperature level $T_0$ and a higher temperature level $T_1$. The current thresholds used in this embodiment can be per-phase current thresholds (as described above in connection with FIG. 3) or total current thresholds for each number of phases in operation (as described above in connection with FIG. 4).

In more detail, the digital controller 110 sets the nominal current thresholds, the current threshold increment step value and a wait period $t_{wait}$ (Block 500). After the wait period $t_{wait}$ lapses (Block 510), the phase add/drop unit 152 determines whether the measured/estimated temperature (T) of the multiphase regulator 106 exceeds the higher temperature level $T_1$ (Block 520). If so, the phase add/drop unit 152 decrements the nominal current thresholds by the current threshold increment step value (Block 530) and waits another period $t_{wait}$ (Block 510) before checking the temperature condition again in Block 520. If instead the measured/estimated temperature (T) does not exceed the higher temperature level $T_1$ at Block 520, the phase add/drop unit 152 determines whether the measured/estimated temperature (T) is below the lower temperature level $T_0$ (Block 540). If so, the phase add/drop unit 152 increments the nominal current thresholds by the current threshold increment step value (Block 550) and waits another period $t_{wait}$ (Block 510) before checking the temperature condition again in Block 520.

The illustration on the left-hand side of FIG. 5 provides a graphical representation of the adaptive phase add/drop control algorithm illustrated on the right-hand side of FIG. 5. The adaptive phase add/drop control algorithm adjusts, by increasing or decreasing, the nominal current thresholds (per-phase or total current thresholds) based on temperature to maintain the measured/estimated temperature in a window defined by $T_0$ and $T_1$. The higher temperature level $T_1$ is set to be lower than the maximum temperature $T_{max}$ which triggers a standard overtemperature shutdown procedure carried out by the digital controller 110.

With this approach, the current thresholds eventually increase back to the initial nominal values if the measured/estimated temperature remains below temperature $T_0$ for a sufficient time period. The current thresholds are decreased to prevent phase dropping if the measured/estimated temperature goes above temperature $T_1$. The current thresholds remain at a reduced threshold when the multiphase regulator operates in a temperature range $T_0$ and $T_1$.

With this approach, the nominal current thresholds are adjusted to maintain the measured/estimated temperature between the lower first temperature level $T_0$ and the upper second temperature level $T_1$, by incrementally decreasing the nominal current thresholds in defined steps responsive to the measured/estimated temperature exceeding $T_1$ and incrementally increasing the nominal current thresholds in defined steps responsive to the measured/estimated temperature falling below $T_0$. If the current thresholds presently in effect maintain the measured/estimated temperature between $T_1$ and $T_0$, no further adjustments are made to the current thresholds.

The phase add/drop unit 152 need only periodically check if T>T1 and if T<T0 (Blocks 510, 520 and 540). Only if the measured/estimated temperature falls outside the window defined by $T_1$ and $T_0$ does the phase add/drop unit 152 make incremental changes to the current thresholds in defined steps. In one embodiment, the defined steps are a percentage of the nominal current thresholds to maintain a fixed ratio between the current thresholds as the current thresholds change. As with the other embodiments described herein, the phase add/drop unit 152 of the digital controller 110 can operate the multiphase regulator 106 with a maximum number of phases (power stages) in operation while preventing any of the phases from being dropped, responsive to the measured/estimated temperature exceeding the higher second temperature level $T_1$, the higher second temperature level $T_1$ being below the maximum temperature limit $T_{max}$.

The adaptive phase add/drop control algorithm embodiments described herein can be readily implemented by the digital controller 110. If the digital controller 110 has access to fan data such as fan speed during use, the lower and upper temperature levels $T_0$ and $T_1$ can be modified in the field based on actual fan behavior (learning). Otherwise, the system can be characterized and the temperature parameters $T_0/T_1$ set based on the characterization data. The selection of the lower and upper temperature levels $T_0$ and $T_1$ is application specific, and depends on the amount of power permitted for thermal management. If thermal management power is relatively low, the $T_0$ threshold can be set relatively high. If thermal management power is high, the $T_0$ threshold can be set relatively low.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of controlling a multiphase regulator having a variable number of phases in operation and nominal current thresholds for indicating when to add or drop a phase in operation, the method comprising:
    measuring or estimating a current in the multiphase regulator;
    measuring or estimating a temperature of the multiphase regulator;
    adjusting the nominal current thresholds based on the temperature to yield adjusted current thresholds which are a function of temperature; and
    modifying the number of phases of the multiphase regulator in operation based on the current and the adjusted nominal current thresholds,
    wherein the nominal current thresholds comprise a first per-phase nominal current threshold for indicating when to add a phase of the multiphase regulator in operation and a second per-phase nominal current threshold for indicating when to drop a phase of the multiphase regulator in operation,
    wherein adjusting the nominal current thresholds based on the temperature comprises reducing the first and second per-phase nominal current thresholds responsive to the temperature exceeding a first temperature level.

2. The method of claim 1, wherein reducing the first and second per-phase nominal current thresholds responsive to the temperature exceeding the first temperature level comprises:
    linearly reducing the first and second per-phase nominal current thresholds with a negative slope which is a function of increasing temperature.

3. The method of claim 1, further comprising:
    operating the multiphase regulator with a maximum number of phases while preventing dropping of any phases of the multiphase regulator in operation responsive to the temperature exceeding a second temperature level above the first temperature level and below a maximum temperature limit.

4. The method of claim 1, further comprising:
    operating the multiphase regulator with a maximum number of phases while preventing any of the phases from being dropped, responsive to the temperature exceeding a second temperature level above the first temperature level and below a maximum temperature limit.

5. A digital controller for a multiphase regulator having a variable number of phases in operation and nominal current thresholds for indicating when to add or drop a phase of the multiphase regulator, the digital controller comprising digital circuitry configured to:
    adjust the nominal current thresholds based on a measured or estimated temperature of the multiphase regulator, to yield adjusted current thresholds which are a function of temperature; and
    modify the number of phases of the multiphase regulator in operation based on the adjusted nominal current thresholds and a measured or estimated current in the multiphase regulator,
    wherein the nominal current thresholds comprise a first per-phase nominal current threshold for indicating when to add a phase of the multiphase regulator in operation and a second per-phase nominal current threshold for indicating when to drop a phase of the multiphase regulator in operation, and wherein the digital circuitry is configured to reduce the first and second per-phase nominal current thresholds responsive to the temperature exceeding a first temperature level.

6. The digital controller of claim 5, wherein the digital circuitry is configured to operate the multiphase regulator with a maximum number of phases while preventing any of the phases from being dropped, responsive to the temperature exceeding a second temperature level above the first temperature level and below a maximum temperature limit.

7. The digital controller of claim 5, wherein the digital circuitry is configured to operate the multiphase regulator with a maximum number of phases while preventing any of the phases from being dropped, responsive to the temperature exceeding a second temperature level above the first temperature level and below a maximum temperature limit.

8. The digital controller of claim 5, wherein the digital circuitry comprises a microcontroller and firmware configured to adjust the nominal current thresholds based on the temperature to yield the adjusted nominal current thresholds which are a function of temperature.

9. A multiphase regulator, comprising:
    a plurality of power stages each configured to provide a phase of the multiphase regulator to a load; and
    a digital controller configured to:
    store nominal current thresholds for indicating when to add or drop a phase of the multiphase regulator;
    adjust the nominal current thresholds based on a measured or estimated temperature of the multiphase regulator, to yield adjusted current thresholds which are a function of temperature; and
    modify the number of phases of the multiphase regulator in operation based on the adjusted nominal current thresholds and a measured or estimated current in the multiphase regulator,
    wherein the nominal current thresholds comprise a first per-phase nominal current threshold for indicating when to add a phase of the multiphase regulator in operation and a second per-phase nominal current threshold for indicating when to drop a phase of the multiphase regulator in operation,
    wherein the digital controller is configured to reduce the first and second per-phase nominal current thresholds responsive to the temperature exceeding a first temperature level.

10. An electronic component, comprising:
    a board;
    a load attached to the board;
    a plurality of power stages attached to the board and each configured to provide a phase current to the load;

at least one fan configured to cool the plurality of power stages and the load; and a digital controller configured to:

store nominal current thresholds for indicating when to add or drop a phase of the multiphase regulator;

adjust the nominal current thresholds based on a measured or estimated temperature of the multiphase regulator, to yield adjusted current thresholds which are a function of temperature; and modify the number of phases of the multiphase regulator in operation based on the adjusted nominal current thresholds and a measured or estimated current in the multiphase regulator, wherein the nominal current thresholds comprise a first per-phase nominal current threshold for indicating when to add a phase of the multiphase regulator in operation and a second per-phase nominal current threshold for indicating when to drop a phase of the multiphase regulator in operation, wherein the digital controller is configured to reduce the first and second per-phase nominal current thresholds responsive to the temperature exceeding a first temperature level.

11. The electronic component of claim 10, wherein the digital controller is configured to increase the number of phases in operation based on the adjusted nominal current thresholds in a light-load condition when demand from the load is low, even if the nominal current thresholds indicate that fewer phases should be in operation.

12. A method of controlling a multiphase regulator having a variable number of phases in operation and nominal current thresholds for indicating when to add or drop a phase in operation, the method comprising:

measuring or estimating a current in the multiphase regulator;

measuring or estimating a temperature of the multiphase regulator;

adjusting the nominal current thresholds based on the temperature to yield adjusted current thresholds which are a function of temperature;

modifying the number of phases of the multiphase regulator in operation based on the current and the adjusted nominal current thresholds; and operating the multiphase regulator with a maximum number of phases while preventing any of the phases from being dropped, responsive to the temperature exceeding a high temperature level, the high temperature level being below a maximum temperature limit.

13. A digital controller for a multiphase regulator having a variable number of phases in operation and nominal current thresholds for indicating when to add or drop a phase of the multiphase regulator, the digital controller comprising digital circuitry configured to:

adjust the nominal current thresholds based on a measured or estimated temperature of the multiphase regulator, to yield adjusted current thresholds which are a function of temperature;

modify the number of phases of the multiphase regulator in operation based on the adjusted nominal current thresholds and a measured or estimated current in the multiphase regulator; and operate the multiphase regulator with a maximum number of phases while preventing any of the phases from being dropped, responsive to the temperature exceeding a second temperature level above the first temperature level and below a maximum temperature limit.

* * * * *